US008865486B2

(12) United States Patent
Kim et al.

(10) Patent No.: US 8,865,486 B2
(45) Date of Patent: Oct. 21, 2014

(54) ORGANIC LIGHT EMITTING DISPLAY DEVICE AND METHOD FOR FABRICATING THE SAME

(71) Applicant: LG Display Co., Ltd., Seoul (KR)

(72) Inventors: Jun-Jung Kim, Goyang-si (KR); Hee-Suk Pang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/258,783

(22) Filed: Apr. 22, 2014

(65) Prior Publication Data

US 2014/0227810 A1    Aug. 14, 2014

Related U.S. Application Data

(62) Division of application No. 13/626,609, filed on Sep. 25, 2012, now Pat. No. 8,742,436.

(30) Foreign Application Priority Data

Sep. 30, 2011    (KR) .................. 10-2011-0099986

(51) Int. Cl.
  *H01L 21/00* (2006.01)
  *H01L 27/32* (2006.01)
  *H01L 51/56* (2006.01)
(52) U.S. Cl.
  CPC ............ *H01L 51/56* (2013.01); *H01L 27/3244* (2013.01); *H01L 27/322* (2013.01); *H01L 27/3211* (2013.01)
  USPC .................. 438/23; 438/22; 438/28; 438/29; 257/40; 257/89; 257/E27.119; 257/E51.022
(58) Field of Classification Search
  CPC ............. H01L 27/332; H01L 27/3258; H01L 27/3223; H01L 27/3213; H01L 2227/323
  USPC ...................... 438/22, 23, 28, 29; 257/40, 89, 257/E27.119, E51.022
  See application file for complete search history.

(56) References Cited

U.S. PATENT DOCUMENTS 7,129,632 B2    10/2006 Park et al.
7,402,948 B2    7/2008 Yamazaki et al.
7,915,808 B2 *    3/2011 Yamazaki ..................... 313/504

* cited by examiner

*Primary Examiner* — Thinh T Nguyen
(74) *Attorney, Agent, or Firm* — Birch, Stewart, Kolasch & Birch, LLP

(57) ABSTRACT

The present application relates to a method for fabricating an organic light emitting display device, comprising: forming a drive thin film transistor on a substrate at a non-light emission region; forming a protective layer on the substrate; forming a color filter on the protective layer; forming a planarizing layer on a protective layer including the color filter; selectively removing the protective layer and the light compensating layer to form a first drain contact hole which exposes a drain electrode of the drive thin film transistor; forming a light compensating layer on the planarizing layer to have a second drain contact hole which exposes the first contact hole, and a dummy hole to expose the planarizing layer; and forming an organic light emitting element on the light compensating layer to be in contact with the drain electrode through the first and second drain contact holes.

6 Claims, 6 Drawing Sheets

ORGANIC LIGHT EMITTING DISPLAY DEVICE AND METHOD FOR FABRICATING THE SAME

CROSS-REFERENCE TO RELATED APPLICATIONS

This application is a Divisional of co-pending application Ser. No. 13/626,609 filed on Sep. 25, 2012, which claims priority to Korean Patent Application No. 10-2011-0099986, filed on Sep. 30, 2011, the entire contents of all of the above applications are hereby incorporated by reference.

BACKGROUND OF THE DISCLOSURE

1. Field of the Disclosure

The present invention relates to organic light emitting display devices, and more particularly to an organic light emitting display device which can prevent a light compensation layer from cracking; and a method for fabricating the same.

2. Discussion of the Related Art

An image display device which realizes various pieces of information is a core technology of an information and communication times and developing in a direction of high performance while thinner, lighter, and portable. Recently, as a bendable flexible display is in demand owing to pursuance of spatial convenience, the organic light emitting display device is spot lighted, in which a light emitting quantity of an organic light emitting layer thereof is controlled by a flat display device.

The organic light emitting display device has a thin film transistor array on a substrate, an organic light emitting display element on the thin film transistor array, and a glass cap for isolating the organic light emitting display device from an external environment. The organic light emitting display device uses electroluminescence in which a light is emitted by coupling energy of an electron and a hole. If an electric field is applied to a cathode and an anode formed on both ends of an organic light emitting layer, the electron and the hole are injected and transmitted to the organic light emitting layer, and the electron and the hole which form a pair in the organic light emitting layer drops from an excited state to a base state to emit the light.

In detail, the organic light emitting display device is provided with sub-pixels disposed at every region defined as gate lines GL and data lines DL cross. Each of the sub-pixels receives a data signal supplied through the data line DL whenever a gate pulse is supplied to the gate line GL to emit the light corresponding to the data signal.

FIG. 1 illustrates a circuit diagram of a related art organic light emitting display device, and FIG. 2 illustrates a photograph of a light compensating layer having a crack taken place therein.

Referring to FIG. 1, each of the sub-pixels has an organic light emitting element EL having a cathode connected to a ground voltage source GND, and a cell drive unit 152 connected to a gate line GL, a data line DL, and a supply voltage source VDD as well as an anode of the organic light emitting element EL for driving the organic light emitting element EL. The cell drive unit 152 has a switching thin film transistor T1, a drive thin film transistor T2, and a capacitor C.

The switching thin film transistor T1 is turned on when a scan pulse is supplied to the gate line GL to supply a data signal supplied to a data line DL to a first node N1. The data signal supplied to the first node N1 is charged to the capacitor C, and supplied to a gate terminal of the drive thin film transistor T2. The drive thin film transistor T2 controls a current being supplied to the organic light emitting element EL from the supply voltage source VDD in response to the data signal supplied to the gate terminal to control a light emitting quantity of the organic light emitting element EL.

And, since the capacitor C discharges the data signal even if the switching thin film transistor T1 is turned off, the drive thin film transistor T2 supplies the current from the supply voltage source VDD to the organic light emitting element EL to sustain the light emission from the organic light emitting element EL until a next frame data signal is supplied.

The drive thin film transistor has an active layer with a source region, a channel region, and a drain region, a gate electrode overlapped with the channel region of the active layer with a gate insulating film disposed therebetween, a source electrode connected to the source region insulated from the gate electrode with an interlayer insulating film disposed therebetween, and a drain electrode connected to the drain region. There are a protective layer formed on the interlayer insulating film including the source and drain electrodes, and a color filter formed on the protective layer. There are a planarizing layer formed on the protective layer including the color filter, and the organic light emitting element formed on the planarizing layer in contact with the drain electrode exposed by selective removal of the protective layer and the planarizing layer.

In the meantime, if the organic light emitting display device is a white organic light emitting display device which emits a white light, since the white color is produced by mixing red, green and blue R, G, B color filters, light emitting quantities of the red color, the green color and the blue color R, G, B vary depending upon an angle of view, causing color shift to drop a display quality.

Consequently, in order to prevent the color shift from taking place, the white organic light emitting display device has a light compensating layer formed of an inorganic material on the planarizing layer. However, stress is generated at a boundary of the light compensating layer and the planarizing layer due to a difference of thermal expansive coefficients between the light compensating layer and the planarizing layer to cause a crack at the light compensating layer, as shown in FIG. 2. In this case, an anode formed on the light compensating layer is broken, dropping reliability of the organic light emitting display device.

SUMMARY OF THE DISCLOSURE

Accordingly, the present invention is directed to an organic light emitting display device, and a method for fabricating the same.

An object of the present invention is to provide an organic light emitting display device in which a dummy hole is formed in a light compensation layer to moderate stress at a boundary of the light compensating layer and the planarizing layer; and a method for fabricating the same.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device includes a plurality of sub-pixels formed on a substrate, wherein each sub-pixel having a light emission region and a non light emission region includes; a drive thin film transistor on the substrate at the non light emission region, a protective layer on the substrate including the drive thin film transistor, a color filter on the protective layer at the emission region, a planarizing layer on the protective layer including the color filter, a first drain contact hole in the protective layer and the planarizing layer to expose a drain electrode of the drive thin film transistor, a light compensating layer on the planarizing layer, the light compensating layer having a second drain contact hole which exposes the first drain contact hole and one or a plurality of dummy holes which expose the planarizing layer, and an organic light emitting element on the light compensating layer to be in contact with the drain electrode through the first and second drain contact holes and including a first electrode, an organic light emitting layer, and a second electrode.

The dummy holes have a total area the same with an area of the drain second contact hole.

The light compensating layer is an inorganic film of a silicon group material, such as SiNx and SiO$_2$.

In another aspect of the present invention, a method for fabricating an organic light emitting display device having a plurality of sub-pixels, each having a light emission region and a non-light emission region, comprising the steps of: forming a drive thin film transistor on a substrate at non-light emission region; forming a protective layer on the substrate including the drive thin film transistor; forming a color filter on the protective layer; forming a planarizing layer on the protective layer including the color filter; selectively removing the protective layer and the light compensating layer to form a first drain contact hole which exposes a drain electrode of the drive thin film transistor; forming a light compensating layer on the planarizing layer to have a second drain contact hole which exposes the first contact hole, and at least one dummy hole to expose the planarizing layer; and forming an organic light emitting element on the light compensating layer to be in contact with the drain electrode through the first and second drain contact holes.

The second drain contact hole and the at least one dummy hole are formed by dry etching.

The dummy hole has a total area the same with an area of the second drain contact hole.

The light compensating layer is an inorganic film of a silicon group material, such as SiNx and SiO$_2$.

Thus, the organic light emitting display device, and the method for fabricating the same of the present invention minimizes the stress transmitted to the light compensating layer by moderating thermal expansive force of the planarizing layer with the dummy hole in the light compensating layer which is formed on the planarizing layer 190 for preventing color shift from taking place. Eventually, the light compensating layer is prevented from cracking, thereby improving reliability of the organic light emitting display device.

It is to be understood that both the foregoing general description and the following detailed description of the present invention are exemplary and explanatory and are intended to provide farther explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

The organic light emitting display device of the present invention which is a white organic light emitting display device may produce the white color only with red, green, and blue sub-pixels, or, in order to obtain a high white color luminance, a white color sub-pixel which produces the white color may be added to the red, green, and blue sub-pixels to form one pixel of the red, green, blue, and white sub-pixels.

An organic light emitting display device, and a method for fabricating the same of the present invention will be described with reference to the attached drawings, in detail.

Figure 1:
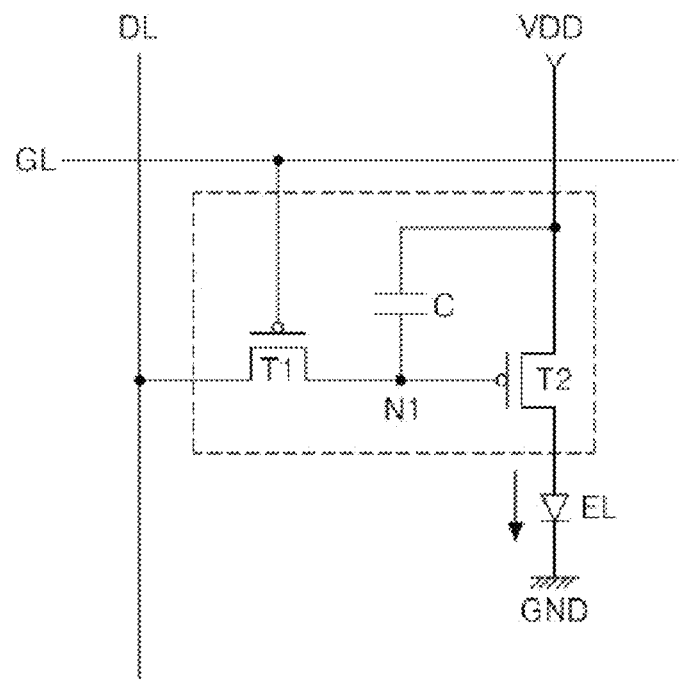
FIG. 1 illustrates a circuit diagram of a related art organic light emitting display device.
Figure 2:
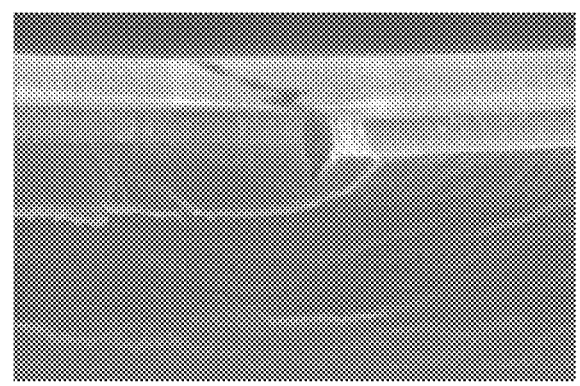
FIG. 2 illustrates a photograph of a light compensating layer having a crack taken place therein.
Figure 3A:
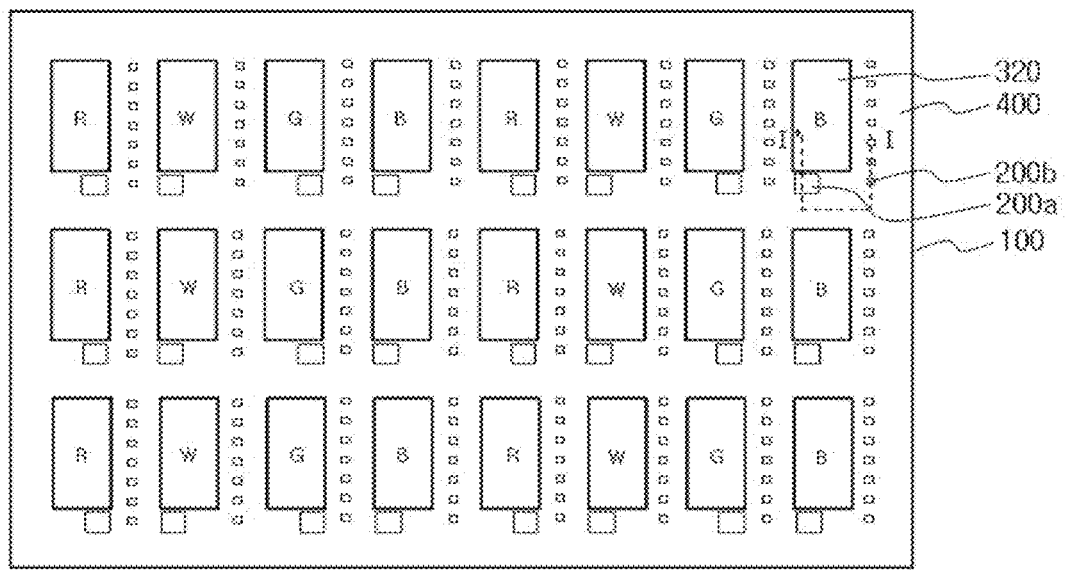
FIG. 3A illustrates a plan view of an organic light emitting display device in accordance with a preferred embodiment of the present invention.
Figure 3B:
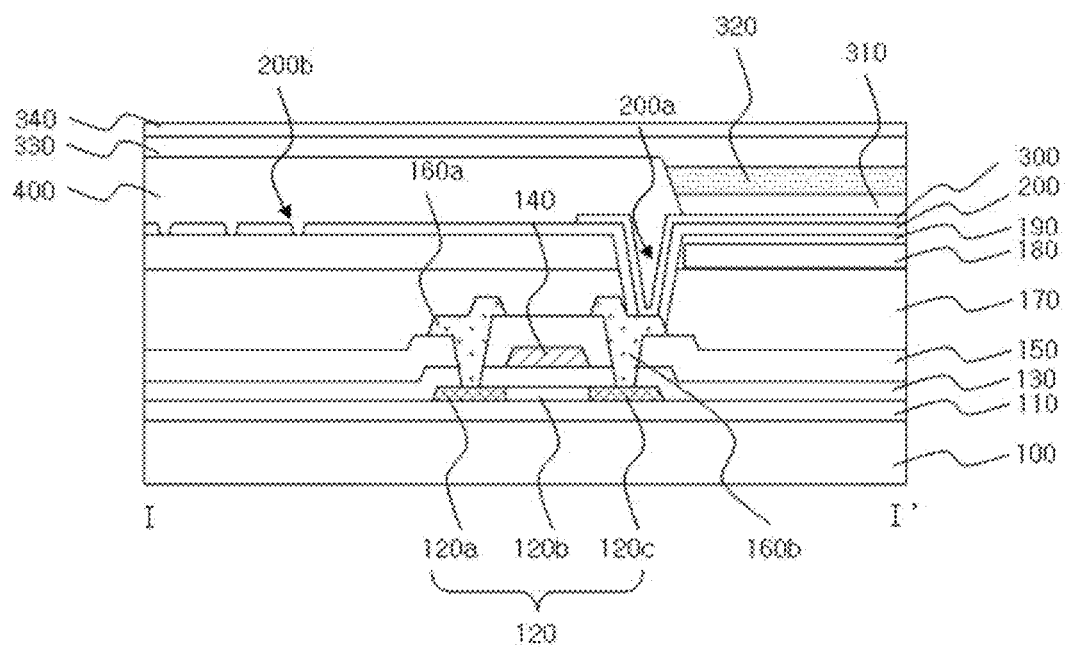
FIG. 3B illustrates a section across a line I-I' in FIG. 3A.
Figure 4:
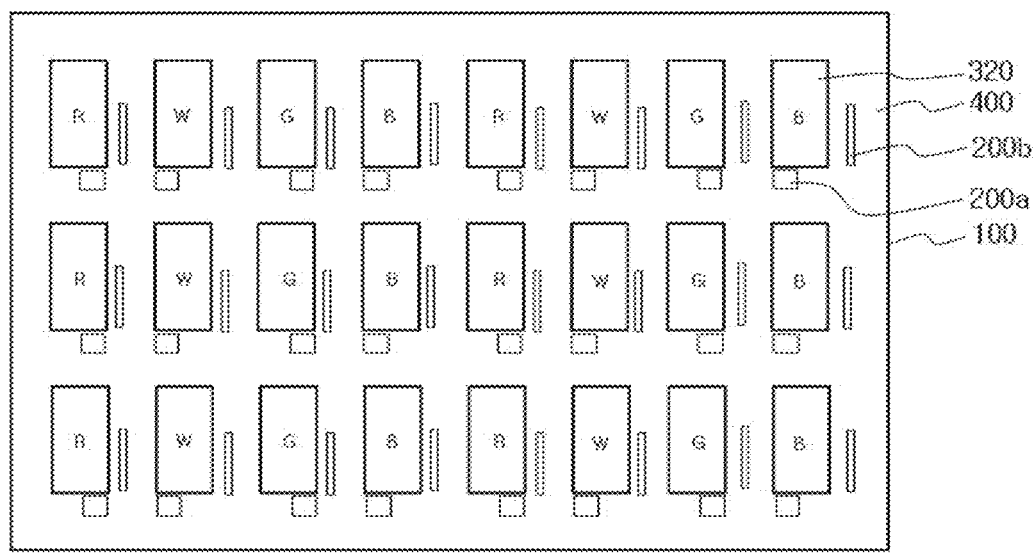
FIG. 4 illustrates a plan view of an organic light emitting display device in accordance with another preferred embodiment of the present invention.

FIG. 3A illustrates a plan view of an organic light emitting display device in accordance with a preferred embodiment of the present invention, FIG. 3B illustrates a section across a line I-I' in FIG. 3A, and FIG. 4 illustrates a plan view of an organic light emitting display device in accordance with another preferred embodiment of the present invention.

Referring to FIG. 3A, the organic light emitting display device of the present invention has a plurality of red R, green G, blue B, and white W sub-pixels formed on a substrate 100 to form one pixel of the red R, green G, blue B, and white W sub-pixels. An arrangement of the red R, green G, blue B, and white W sub-pixels is not limited to an arrangement shown in the drawing.

Each of the red R, green G, blue B, and white W sub-pixels includes a drive thin film transistor formed on the substrate 100 and an organic light emitting element connected to the drive thin film transistor. The drive thin film transistor has an active layer 120, a gate electrode 140 and source and drain electrodes 160a and 160b.

At first, as shown in FIG. 3B, a buffer layer 110 is formed on the substrate 100, and the active layer 120 having a source region 120a, a drain region 120c and a channel region between the source and drain regions 120a and 120c is formed on the buffer layer 110. A gate insulating film 130 is formed on the substrate including the active layer 120. Then, the gate electrode 140 is formed on the gate insulating film 130 to overlap with the channel region 120c of the active region 120.

An interlayer insulating film 150 is formed on the gate insulating film 130 including the gate electrode 140. The source electrode 160a and a drain electrode 160b insulated from the gate electrode 140 are formed on the interlayer insulating film 150. The source electrode 160*a* and the drain electrode 160*b* are in contact with the source region 120*a* and the drain region 120*c* of the active layer 120 through contact holes passed through the interlayer insulating film 150 and the gate insulating film 130, respectively.

A protective layer 170 is formed on the interlayer insulating film 150 including the source electrode 160*a* and the drain electrode 160*b*. The protective layer 170 is formed of an inorganic insulating material or an organic insulating material. A color filter 180 is formed on the protective layer 170 at a light emission region. A planarizing layer of an organic material is formed on an entire surface of the protective layer 170 including the color filter 180. And, by selective removal of the protective layer 170 and the planarizing layer 190, a first drain contact hole (Not numbered) is formed, which exposes the drain electrode 160*b* of the drive thin film transistor.

A light compensating layer 200 is formed on the planarizing layer 190. The light compensating layer 200 is formed of a silicon group inorganic material, such as SiNx, and $SiO_2$ for preventing color shift from taking place due to differences of light emission quantities of the red R, green G, and blue B colors depending on an angle of view. Particularly, it is preferable that the light compensating layer 200 is formed of a transparent inorganic film having transmittancy of 50% to 100% so that the light from the organic light emitting layer to be described later is emitted through the substrate 100.

The light compensating layer is formed on an entire surface of the planarizing layer having the first drain contact hole. The light compensating layer has a second drain contact hole 200*a* by removing a portion of a region corresponding to the first drain contact hole for connecting the organic light emitting display element formed on the light compensating layer to the drain electrode 160*b*. However, as described before, a difference of thermal expansive coefficients of the light compensating layer 200 which is an inorganic layer and the planarizing layer 190 which is an organic layer causes stress at a boundary of the light compensating layer 200 and the planarizing layer 190 to cause a crack at the light compensating layer 200.

In general, an inorganic substance has a thermal expansive coefficient different from an organic substance. When the light compensating layer 200 is formed on the planarizing layer 190, or a process is progressed, in which a thin film is formed on the light compensating layer additionally, a heat treatment process is accompanied. However, since the planarizing layer 190 has a thermal expansive coefficient higher than the thermal expansive coefficient of the light compensating layer, the stress is caused at the time of heat treatment due to the difference of the thermal expansive coefficients, which may cause a defect of irregular bending or a fine crack at the light compensating layer 200.

And, due to this, an anode 300 formed on the light compensating layer 200 breaks, dropping reliability of the organic light emitting display device. Moreover, since the light compensating layer 200 is formed by a low temperature process for preventing damage, such as thermal decomposition, from taking place at the planarizing layer 190, density of the light compensating layer is low to increase a probability of causing the bending defect or the crack.

Therefore, in order to prevent the crack from taking place at light compensating layer 200 by moderating the stress at the planarizing layer 190 and the light compensating layer 200, the light compensating layer 200 is removed selectively to form one or a plurality of dummy holes 200*b* which expose the planarizing layer 190. As shown in FIG. 4, if the dummy hole 200*b* is one, the dummy hole 200*b* may be formed in a bar shape.

Eventually, the organic light emitting display device of the present invention makes the expansive force of the boundary at which the light compensating layer 200 and the planarizing layer 190 are in contact to concentrate at the dummy hole 200*b* when the planarizing layer 190 expands thermally following elevation of a temperature of the planarizing layer 190. And, the dummy hole 200*b* moderates the expansive force of the planarizing layer 190, minimizing the stress between the planarizing layer 190 and the light compensating layer 200, which minimizes the stress to the light compensating layer 200 preventing the crack from taking place at the light compensating layer 200, at the end.

Especially, the dummy hole 200*b* is formed on one side of the color filter 180. Since an organic light emitting layer 320 is formed on the color filter 180, it is preferable that the dummy hole 200*b* is formed at a non-light emission region which does not face the red R, green G, blue B, and white W sub-pixels, for preventing an aperture region from becoming smaller. The dummy hole 200*b* may be singular or plural, and, since the dummy hole 200*b* is formed at the same time with the second drain contact hole 200*a*, it is preferable that a total area of the dummy hole 200*b* is the same with an area of the second drain contact hole 200*a* to balance etch rates. This is for preventing the planarizing layer 190 or the drain electrode 160*b* from being etched by etch gas when an inorganic film formed for forming the light compensating layer 200 on the entire surface of the planarizing layer 190 is removed selectively by dry etching for forming the dummy hole 200*b* and the second drain contact hole 200*a*. If the area of the dummy hole 200*b* is different from the area of the second drain contact hole 200*a*, the planarizing layer 190 or the drain electrode 160*b* can be etched by etch gas. Particularly, if the drain electrode 160*b* is etched, defective contact of a first electrode 300 and the drain electrode 160*b* may take place.

The first electrode 300 is formed on the light compensating layer 200 to be in contact with the drain electrode 160*b* through the first and second drain contact holes 190*a* and 200*a*. A bank 400 having bank holes is formed on the light compensating layer 200 including the first electrode 300 for defining a light emission region. The bank hole of the bank 400 exposes the first electrode 300 at the light emission region.

Then, the organic light emitting display element is formed on the first electrode 300. The organic light emitting display element includes the first electrode 300, a Hole injection layer (HIL)(Not shown), a Hole transport layer (HTL) 310, an organic light emitting layer 320, an electron transport layer (ETL) 330, an electron injection layer (EIL) (Not shown), and a second electrode 340.

In detail, the first electrode 300 is formed on the light compensating layer 200 to be connected to the drain electrode 160 through the first and second drain contact holes 200*a*. The first electrode 300, being an anode, is formed of a transparent conductive material, such as ITO (Indium Tin Oxide) and IZO (Indium Zinc Oxide). According to this, the light emits from the organic light emitting layer 320 to the substrate 100 through the first electrode 300.

The hole injection layer (Not shown) and the hole transport layer 310 are formed on the first electrode 300 in the bank hole in succession. The organic light omitting layer 320 is formed on the hole transport layer 310, and the electron transport layer 330, the electron injection layer (Not shown), and the second electrode 340 are formed on the organic light emitting layer 320. The second electrode 340, being a cathode, is formed of a reflective metal such as aluminum Al for reflecting the light front the organic light emitting layer 320 toward the first electrode 300.

The organic light emitting display device produces an exciton if a voltage is applied between the first electrode 300 and the second electrode 340 as the hole injected from the first electrode 300 to organic light emitting layer 320 and the electron injected from the second electrode 340 to the organic light emitting layer 320 re-couple in the organic light emitting layer 320. And, as the exciton drops to a ground state, the light emits, and as the light passes through the color filter under the organic light emitting display device, a light of a color corresponding to the color filter 180 is emitted.

FIGS. 5A to 5G illustrate sections showing the steps of a method for fabricating an organic light emitting display device in accordance with a preferred embodiment of the present invention.

Figure 5A:
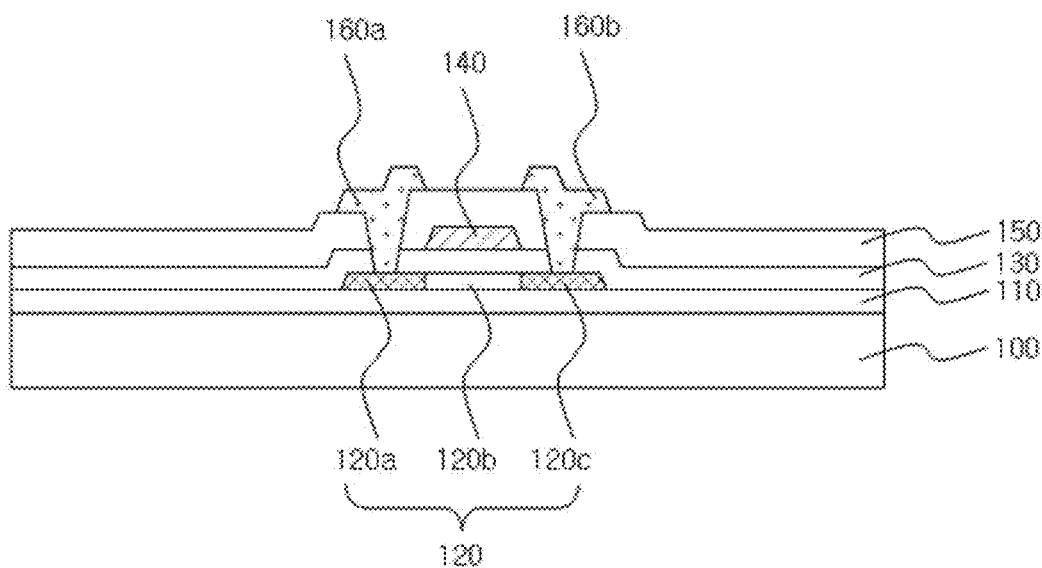
FIGS. 5A to 5G illustrate sections showing the steps of a method for fabricating an organic light emitting display device in accordance with a preferred embodiment of the present invention.

Referring to FIG. 5A, a buffer layer 110 is formed on a substrate 100, and a drive thin film transistor including an active layer 120, a gate electrode 140, a source electrode 160a, and a drain electrode 160b is formed on the buffer layer 110. The drive thin film transistor is formed by a following method.

After Amorphous silicon is deposited on the buffer layer 110, the amorphous silicon is crystallized into polycrystalline silicon by laser beam or heat treatment. The polycrystalline silicon is patterned by photolithography and etching to form an active layer 120. A gate insulating film 130 is formed on an entire surface of the buffer layer 110 including the active layer 120, and a gate electrode 140 is formed on the gate insulating film 130.

And, $n^+$ impurities are injected to both sides of the active layer 120 by using the gate electrode 140 as a mask, to form a source region 120a and a drain region 120c opposite to each other with a channel region 120b of the active region 120 disposed therebetween. An interlayer insulating film 150 is formed on the gate insulating film 130 having the gate electrode 140 formed thereon, and the interlayer insulating film 150 and the gate insulating film 130 are removed selectively, to form first and second contact holes which expose the source region 120a and the drain region 120c at the active layer 120.

A source/drain metal layer (Not shown) is formed on the interlayer insulating film 150 having the first and second contact holes (Not numbered) formed therein, and patterned, to form the source electrode 160a and the drain electrode 160b. In this instance, the source electrode 160a is in contact with the source region 120a through the first contact hole and the drain electrode 160b is in contact with the drain region 120c through the second contact hole.

Figure 5B:
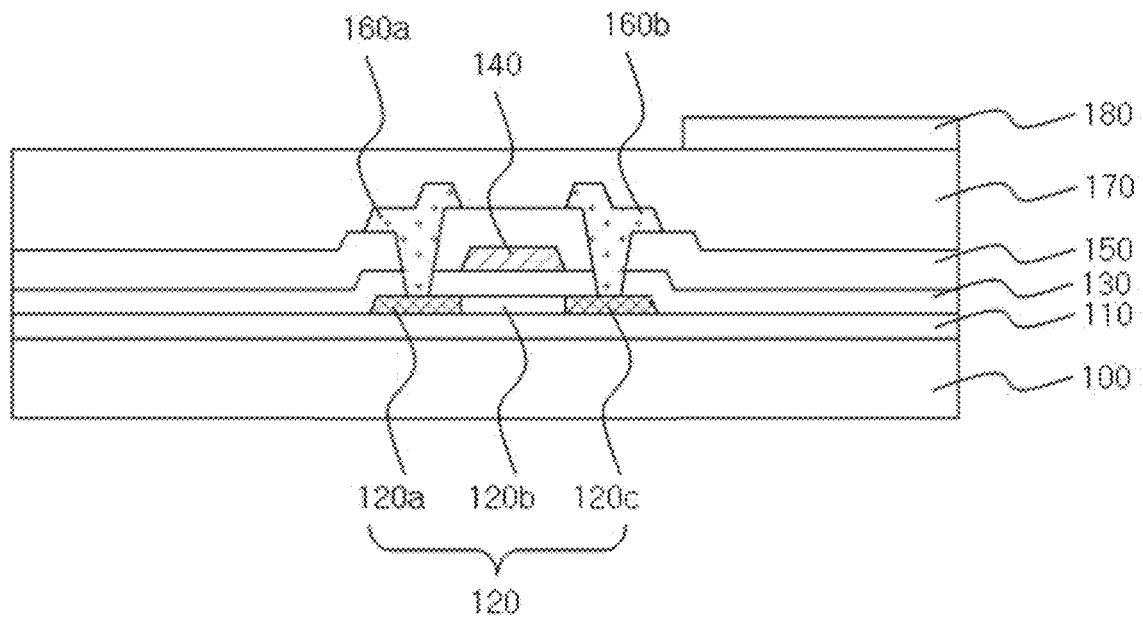
Figure 5C:
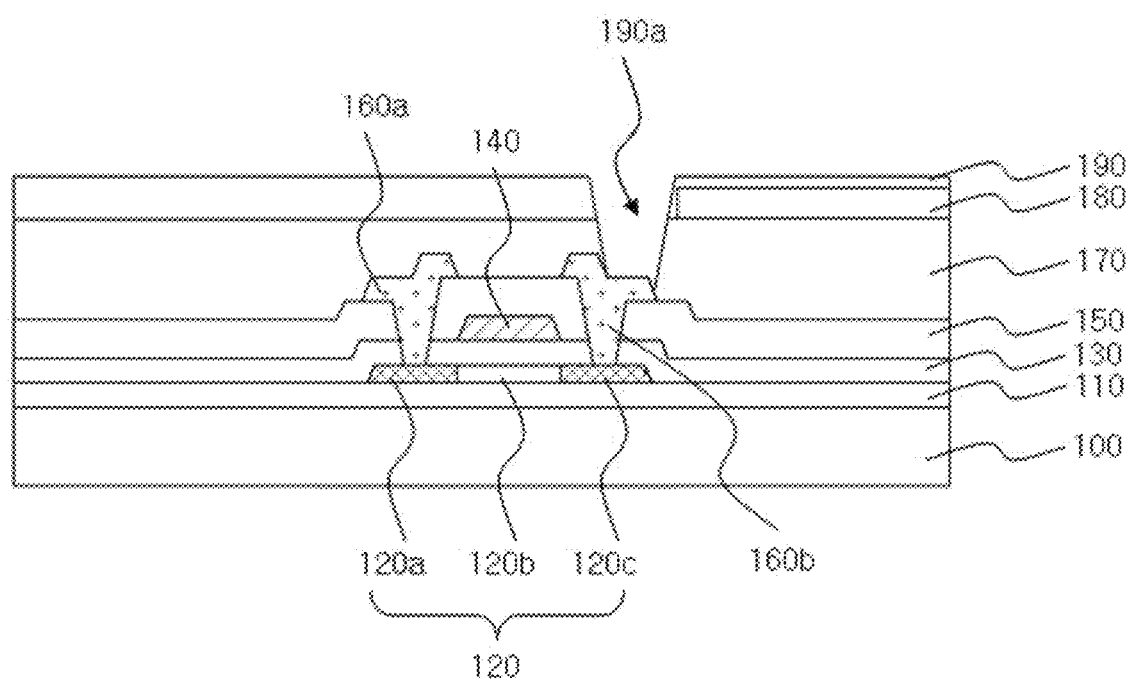

Then, referring to FIG. 5B, a protective layer 170 of organic insulating material or inorganic insulating material is formed on an entire surface of the interlayer insulating film 160 including the source electrode 160a and the drain electrode 160b. A color filter 180 is formed on the protective layer 170, and selectively removed to remain at a light emission region. Then, as shown in FIG. 5C, a planarizing layer 190 is formed on an entire surface of the protective layer 170 including the color filter 180, and the protective layer 170 and the planarizing layer 190 are removed selectively, to form a first drain contact hole 190a which exposes the drain electrode 160b.

Figure 5D:
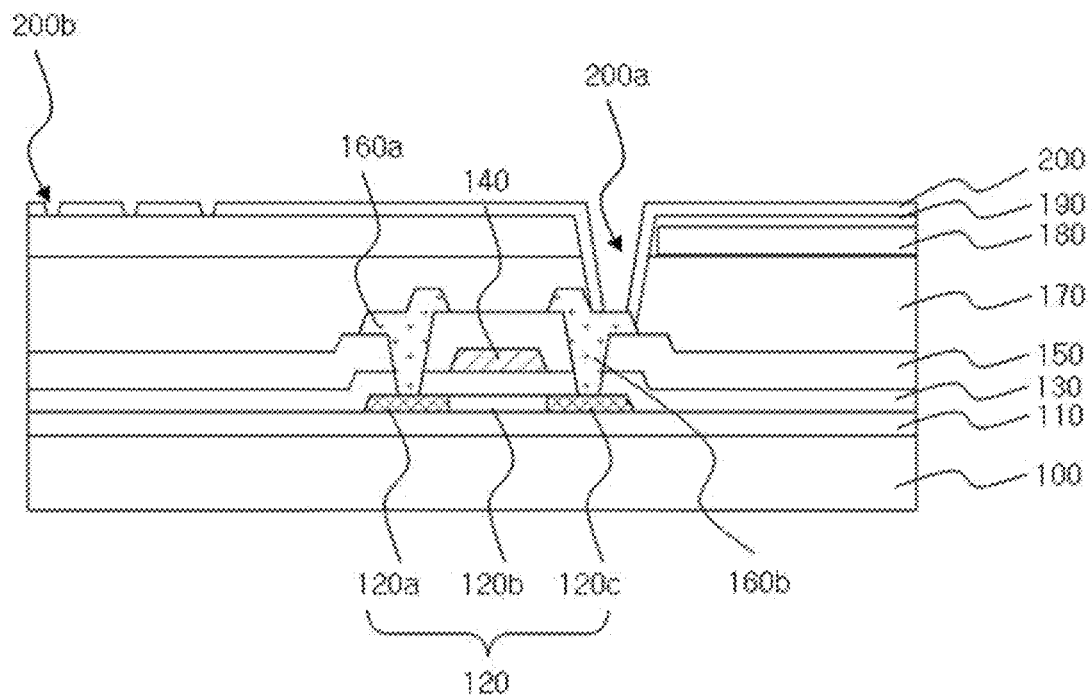

Then, referring to FIG. 5D, an inorganic film (Not shown) of a silicon group, such as $SiN_x$ and $SiO_2$, is deposited on an entire surface of the planarizing layer 190. It is preferable that the inorganic film is a transparent inorganic film having transmittancy of 50% to 100% so that the light from an organic light emitting layer to be described later is emitted through the substrate 100. Then, the inorganic film is removed selectively by photolithography and etching to form a light compensating layer 200.

The light compensating layer 200 includes a second drain contact hole 200a which exposes the drain electrode 160b as a region corresponding to the first drain contact hole 190a, and, at the same time with this, one or a plurality of dummy holes 200b which expose the planarizing layer 190 on one side of the color filter 180. The dummy hole 200b is formed for preventing the light compensating layer from cracking due to stress at a boundary of the light compensating layer 200 and the planarizing layer 190 caused by a difference of thermal expansive coefficients between the light compensating layer 200 of the inorganic film and the planarizing layer 190 of the organic film.

In general, an inorganic substance has a thermal expansive coefficient different from an organic substance. When the light compensating layer 200 is formed on the planarizing layer 190, or a process is progressed, in which a thin film is formed on the light compensating layer additionally, a heat treatment process is accompanied. However, since the planarizing layer 190 has a thermal expansive coefficient higher than the thermal expansive coefficient of the light compensating layer, the stress is caused at the time of the heat treatment due to the difference of the thermal expansive coefficients which may cause a defect of irregular bending or a fine crack at the light compensating layer 200.

Therefore, the present invention suggests forming one or a plurality of dummy holes 200b which expose the planarizing layer 190 by removing the light compensating layer 200 selectively to moderate the stress at the planarizing layer 190 and the light compensating layer 190 for preventing the light compensating layer 200 from cracking. According to this, if the planarizing layer 190 expands thermally as a temperature of the planarizing layer 190 is elevated, expansive force of the boundary at which the light compensating layer 200 and the planarizing layer 190 are in contact concentrates on the dummy hole 200b to moderate the expansive force of the planarizing layer 190.

Particularly, since the dummy holes 200b are formed at the same time with the second drain contact hole 200a, it is preferable that a total area of the dummy holes 200b is the same with an area of the second drain contact hole 200a to balance etch rates.

Figure 5E:
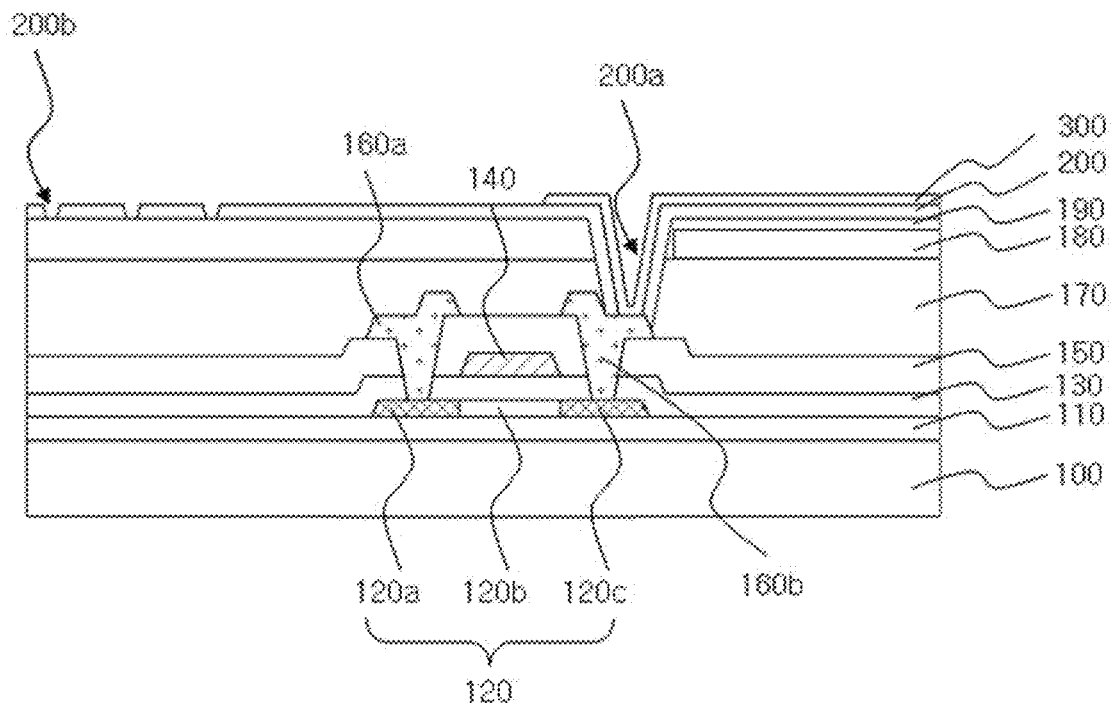
Figure 5F:
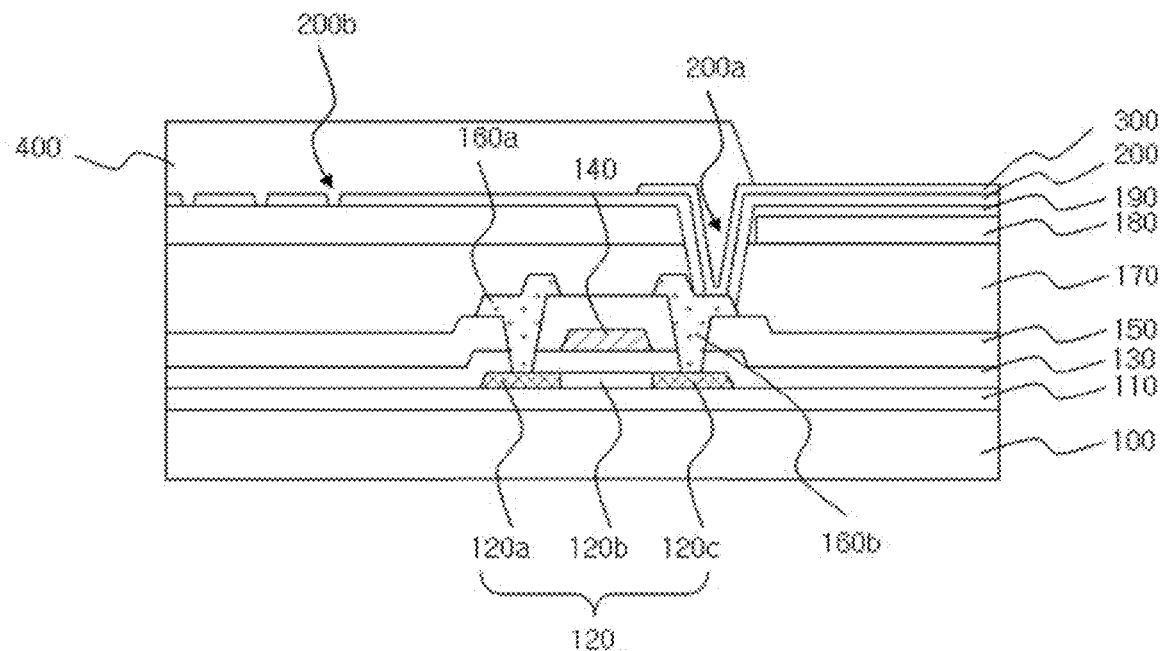

Then, referring to FIG. 5E, a first electrode 300 is formed on the light compensating layer 200 to be in contact with the drain electrode 160b through the first and second drain contact holes 190a and 200a. The first electrode 300 is formed by deposition, such as sputtering. And, as shown in FIG. 5F, a bank 400 is formed on the light compensating layer 200 including the first electrode 300. The bank 400 has a bank hole to expose the first electrode 300 at the light emission region, selectively.

Figure 5G:
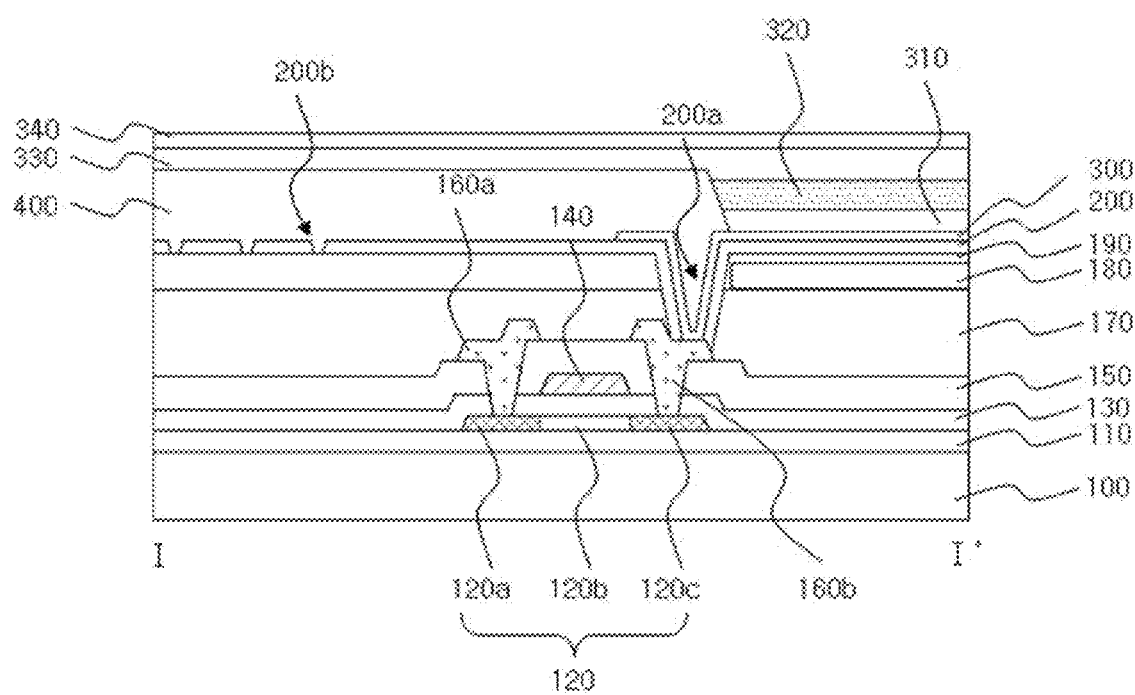

Referring to FIG. 5G, a hole injection layer (Not shown) and a hole transport layer 310 are formed on the first electrode 300 in the bank hole, and an organic light emitting layer 320 is formed on the hole transport layer 310 by a soluble process, such as ink jet, nozzle coating, spray coating, and roll printing. Then, an electron transport layer 330, an electron injection layer (Not shown), and a second electrode 340 are formed on the organic light emitting layer 320.

According to this, the hole and the electron injected into the organic light emitting layer 320 re-couple to form an exciton which drops to a ground state to emit a light, and as the light passes through the color filter 180 under the organic light emitting display element, a light of a color corresponding to the color filter 180 is emitted.

Thus, the organic light emitting display device, and the method for fabricating the same of the present invention minimizes the stress transmitted to the light compensating layer by moderating thermal expansive force of the planarizing layer with the dummy hole in the light compensating layer which is formed on the planarizing layer 190 for preventing color shift from taking place. Eventually, the light compensating layer is prevented from cracking, thereby improving reliability of the organic light emitting display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating an organic light emitting display device having a plurality of sub-pixels, each sub-pixel having a light emission region and a non-light emission region, the method comprising the steps of:

forming a drive thin film transistor on a substrate at non-light emission region;

forming a protective layer on the substrate including the drive thin film transistor;

forming a color filter on the protective layer;

forming a planarizing layer on the protective layer including the color filter;

selectively removing the protective layer and the light compensating layer to form a first drain contact hole which exposes a drain electrode of the drive thin film transistor;

forming a light compensating layer on the planarizing layer to have a second drain contact hole which exposes the first contact hole, and at least one dummy hole to expose the planarizing layer; and forming an organic light emitting element on the light compensating layer to be in contact with the drain electrode through the first and second drain contact holes.

2. The method as claimed in claim 1, wherein the second drain contact hole and the at least one dummy hole are formed by dry etching.

3. The method as claimed in claim 1, wherein the at least one dummy hole has a total area the same with an area of the second drain contact hole.

4. The method as claimed in claim 1, wherein the light compensating layer is an inorganic film of a silicon group material, such as $SiN_x$ and $SiO_2$.

5. The method as claimed in claim 1, wherein the plurality of sub-pixels have red, green, blue and white sub-pixels.

6. The method as claimed in claim 1, wherein the at least one dummy hole is formed at the non-light emission region.

* * * * *